United States Patent
Park et al.

(10) Patent No.: US 9,705,364 B2
(45) Date of Patent: Jul. 11, 2017

(54) WIRELESS POWER TRANSMISSION SYSTEM INCLUDING RELAY RESONATOR AND WIRELESS POWER TRANSMISSION METHOD

(71) Applicants: SAMSUNG ELECTRONICS CO., LTD., Suwon-si (KR); HONGIK UNIVERSITY INDUSTRY-ACADEMIA COOPERATION FOUNDATION, Seoul (KR)

(72) Inventors: Jae Hyun Park, Yongin-si (KR); Young Ho Ryu, Yongin-si (KR); Sang Wook Kwon, Seongnam-si (KR); Ki Young Kim, Yongin-si (KR); Dong Zo Kim, Yongin-si (KR); Bong Chul Kim, Seoul (KR); Ju Hui Kim, Seoul (KR); Byung Chul Park, Seoul (KR); Yun Kwon Park, Dongducheon-si (KR); Keum Su Song, Seoul (KR); Chi Hyung Ahn, Suwon-si (KR); Byoung Hee Lee, Yongin-si (KR); Jeong Hae Lee, Seoul (KR)

(73) Assignees: Samsung Electronics Co., Ltd., Suwon-si (KR); Hongik University Industry-Academia Cooperation Foundation, Seoul (KR)

( * ) Notice: Subject to any disclaimer, the term of this patent is extended or adjusted under 35 U.S.C. 154(b) by 585 days.

(21) Appl. No.: 14/253,410

(22) Filed: Apr. 15, 2014

(65) Prior Publication Data
US 2015/0008753 A1    Jan. 8, 2015

(30) Foreign Application Priority Data

Jul. 2, 2013 (KR) .......................... 10-2013-0077060

(51) Int. Cl.
*H01F 27/42* (2006.01)
*H01F 37/00* (2006.01)
(Continued)

(52) U.S. Cl.
CPC .............. *H02J 50/50* (2016.02); *H02J 5/005* (2013.01); *H02J 50/12* (2016.02); *H03H 7/40* (2013.01)

(58) Field of Classification Search
CPC .. H02J 50/12; H02J 5/005; H02J 7/025; H02J 50/50; H01F 38/14
(Continued)

(56) References Cited

U.S. PATENT DOCUMENTS

2012/0235502 A1    9/2012  Kesler et al.
2014/0142876 A1*   5/2014  John .................... H02J 5/005
                                                    702/60

FOREIGN PATENT DOCUMENTS

JP    2011-151946 A    8/2011
JP    2012-518382 A    8/2012
(Continued)

*Primary Examiner* — Carlos Amaya
(74) *Attorney, Agent, or Firm* — NSIP Law

(57) ABSTRACT

A wireless power transmission method includes searching for one or more routes to be used to transmit power to a reception resonator through one or more relay resonators, and converting the routes to respective one or more two-port networks. The method further includes calculating a transmission efficiency of each of the routes based on the two-port networks, and selecting a route with a highest transmission efficiency from the routes. The method further includes wirelessly transmitting power to the reception resonator through the selected route.

18 Claims, 15 Drawing Sheets

(51) Int. Cl.
  *H01F 38/00*   (2006.01)
  *H02J 50/50*   (2016.01)
  *H03H 7/40*    (2006.01)
  *H02J 5/00*    (2016.01)
  *H02J 50/12*   (2016.01)

(58) Field of Classification Search
  USPC .......................................................... 307/104
  See application file for complete search history.

(56) References Cited

FOREIGN PATENT DOCUMENTS

| KR | 10-2011-0062841 A | 6/2011 |
| KR | 10-2012-0093358 A | 8/2012 |
| KR | 10-2012-0135085 A | 12/2012 |

\* cited by examiner

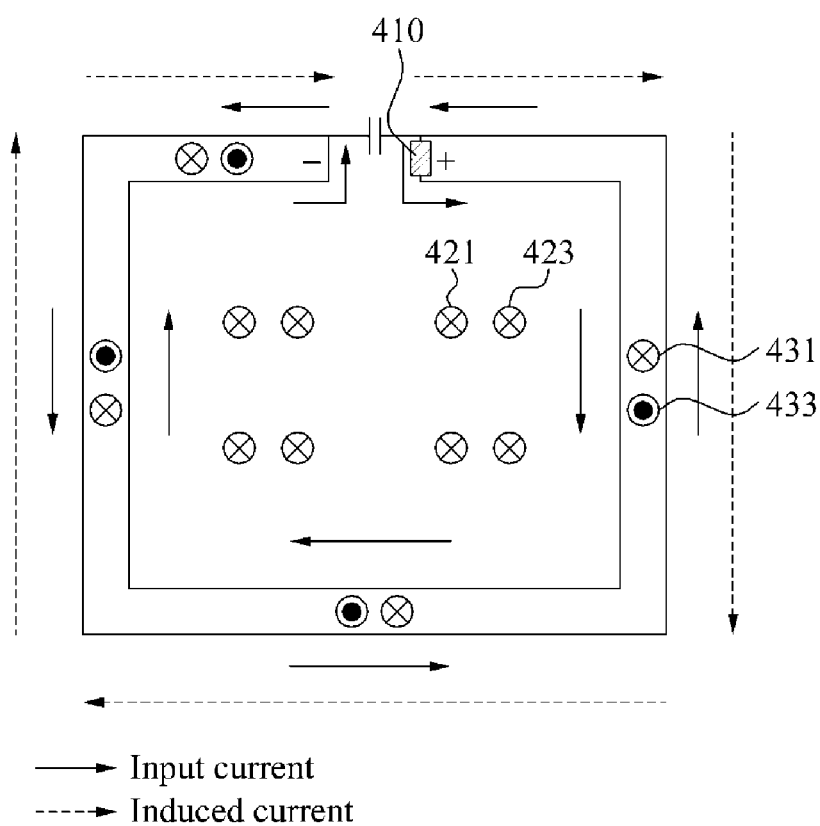

WIRELESS POWER TRANSMISSION SYSTEM INCLUDING RELAY RESONATOR AND WIRELESS POWER TRANSMISSION METHOD

CROSS-REFERENCE TO RELATED APPLICATION

This application claims the benefit under 35 USC 119(a) of Korean Patent Application No. 10-2013-0077060, filed on Jul. 2, 2013, in the Korean Intellectual Property Office, the entire disclosure of which is incorporated herein by reference for all purposes.

BACKGROUND

1. Field

The following description relates to a wireless power transmission system.

2. Description of Related Art

Wireless power refers to energy that is transferred from a wireless power transmission apparatus to a wireless power reception apparatus through magnetic coupling. Accordingly, a wireless power charging system includes a source device configured to wirelessly transmit power, and a target device configured to wirelessly receive power. The source device may be referred to as a wireless power transmission apparatus, and the target device may be referred to as a wireless power reception apparatus.

The source device may include a source resonator, and the target device may include a target resonator. Magnetic coupling or resonant coupling may be formed between the source resonator and the target resonator.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a wireless power transmission method includes searching for one or more routes to be used to transmit power to a reception resonator through one or more relay resonators, and converting the routes to respective one or more two-port networks. The method further includes calculating a transmission efficiency of each of the routes based on the two-port networks, and selecting a route with a highest transmission efficiency from the routes. The method further includes wirelessly transmitting power to the reception resonator through the selected route.

The converting may include converting the routes to respective one or more predetermined ABCD matrices, and the calculating may include calculating the transmission efficiency of each of the routes based on the predetermined ABCD matrices.

The calculating may include calculating a transmission efficiency of a route matched to a load resistance of a wireless power receiver among the routes.

The calculating may include calculating a transmission efficiency of a route among the routes based on a predetermined figure of merit of the route and a load resistance of a wireless power receiver.

The converting may include converting the route to an ABCD matrix, and the calculating may include acquiring the predetermined figure of merit based on an element of the ABCD matrix.

The converting may include converting the route to an ABCD matrix, and the calculating may include extracting the load resistance based on an element of the ABCD matrix.

The selecting may include deactivating resonance of a relay resonator, among the relay resonators, to which power is not transferred, based on the selected route, and activating resonance of a relay resonator, among the relay resonators, to which power is transferred, based on the selected route.

The searching may include receiving information of power transfer from one or more wireless power relays including the relay resonators, and a wireless power receiver including the reception resonator, and searching for the routes based on the information.

The calculating may include calculating a transmission efficiency of a route based on a coupling coefficient determined based on a distance between resonators among a transmission resonator, the relay resonators, and the reception resonator.

In another general aspect, a wireless power transmitter includes a power route searching unit configured to search for one or more routes to be used to transmit power to a reception resonator through one or more relay resonators, and a transmission efficiency calculator configured to convert the routes to respective one or more two-port networks, and calculate a transmission efficiency of each of the routes based on the two-port networks. The wireless power transmitter further includes a route selector configured to select a route with a highest transmission efficiency from the routes, and a power transmitting unit configured to wirelessly transmit power to the reception resonator through the selected route.

The transmission efficiency calculator may be configured to convert the routes to respective one or more predetermined ABCD matrices, and calculate the transmission efficiency of each of the routes based on the predetermined ABCD matrices.

The transmission efficiency calculator may be configured to calculate a transmission efficiency of a route matched to a load resistance of a wireless power receiver among the routes.

The transmission efficiency calculator may be configured to calculate a transmission efficiency of a route among the routes based on a predetermined figure of merit of the route and a load resistance of a wireless power receiver.

The transmission efficiency calculator may be configured to convert the route to an ABCD matrix, and acquire the predetermined figure of merit based on an element of the ABCD matrix.

The transmission efficiency calculator may be configured to convert the route to an ABCD matrix, and extract the load resistance based on an element of the ABCD matrix.

The route selector may be configured to deactivate resonance of a relay resonator, among relay resonators, to which power is not transferred, based on the selected route, and activate resonance of a relay resonator, among relay resonators, to which power is transferred, based on the selected route.

The power route searching unit may be configured to receive information of power transfer from one or more wireless power relays including the relay resonators, and a wireless power receiver including the reception resonator, and search for the routes based on the information.

The transmission efficiency calculator may be configured to calculate a transmission efficiency of a route based on a coupling coefficient determined based on a distance between resonators among a transmission resonator, the relay resonators, and the reception resonator.

In still another general aspect, an apparatus includes a transmission efficiency calculator configured to convert one or more routes to respective one or more matrices, each of the routes including a transmission resonator, one or more relay resonators, and a reception resonator, and calculate a transmission efficiency of each of the routes based on the matrices. The apparatus further includes a route selector configured to select a route with a highest transmission efficiency from the routes, to be used to wirelessly transmit power.

A route, among the routes, may include a transmission-relay end including the transmission resonator and a first one of the relay resonators, a relay end including the relay resonators, and a relay-reception end including a last one of the relay resonators and the reception resonator, and the transmission efficiency calculator may be configured to convert the transmission-relay end, the relay end, and the relay-reception end to respective ABCD matrices, and calculate a transmission efficiency of the route based on a multiplication of the ABCD matrices.

Other features and aspects will be apparent from the following detailed description, the drawings, and the claims.

BRIEF DESCRIPTION OF THE DRAWINGS

FIG. 4A is a diagram illustrating an example of a distribution of a magnetic field in a resonator that is produced by feeding of a feeding unit, of a wireless power transmitter.

Figure 1:
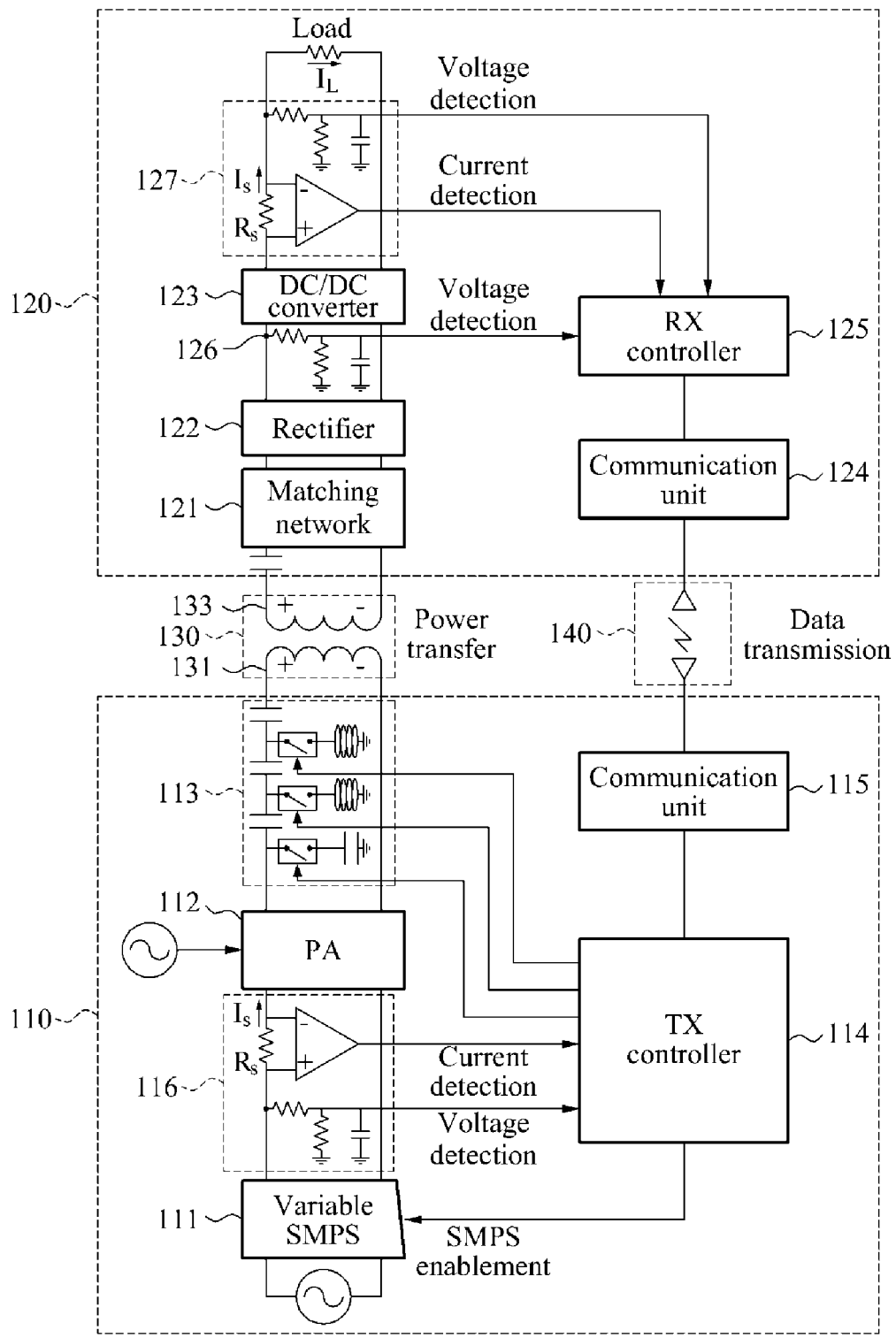
FIG. 1 is a diagram illustrating an example of a wireless power transmission system.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Interest in technologies of wirelessly transmitting power is increasing. Wireless power transmission technologies may include, for example, a technology of wirelessly supplying power to various mobile devices, for example, a mobile phone, a notebook computer, and/or an MP3 player. One of wireless power transmission technologies may be performed using resonance characteristics of radio frequency (RF) devices.

For example, a wireless power transmission system using a resonance characteristic may include a transmission (TX) unit configured to supply power, and a reception (RX) unit configured to receive the supplied power. In this example, only two resonators included in the TX unit and the RX unit may be used; however, there is a limitation to a distance enabling power to be wirelessly transmitted. To increase the distance, a plurality of relay resonators may be used. A single power transmission system may include a plurality of relay resonators located between an TX unit and an RX unit, and accordingly, a higher transmission efficiency may be obtained, compared to a system including only two resonators.

A scheme of performing communication between a source device and a target device may include an in-band communication scheme, and an out-band communication scheme. The in-band communication scheme means communication performed between the source device and the target device in the same frequency band as used for power transmission. The out-band communication scheme means communication performed between the source device and the target device in a separate frequency band than one used for power transmission.

FIG. 1 is a diagram illustrating an example of a wireless power transmission system. Referring to FIG. 1, the wireless power transmission system includes a source device 110 and a target device 120. The source device 110 is a device supplying wireless power, and may be any of various devices that supply power, such as pads, terminals, televisions (TVs), and any other device that supplies power. The target device 120 is a device receiving wireless power, and may be any of various devices that consume power, such as terminals, TVs, vehicles, washing machines, radios, lighting systems, and any other device that consumes power.

The source device 110 includes a variable switching mode power supply (SMPS) 111, a power amplifier 112, a matching network 113, a transmission (TX) controller 114, a communication unit 115, a power detector 116, and a source resonator 131. The target device 120 includes a matching network 121, a rectifier 122, a direct current-to-direct current (DC/DC) converter 123, a communication unit 124, a reception (RX) controller 125, a power detector 127, and a target resonator 133.

The variable SMPS 111 generates a DC voltage by switching an alternating current (AC) voltage having a frequency of tens of hertz (Hz) output from a power supply. The variable SMPS 111 may output a DC voltage having a predetermined level, or may output a DC voltage having an adjustable level by the TX controller 114.

The power detector 116 detects an output current and an output voltage of the variable SMPS 111, and provides, to the TX controller 114, information on the detected current and the detected voltage. Additionally, the power detector 116 detects an input current and an input voltage of the power amplifier 112.

The power amplifier 112 generates a power by converting the DC voltage output from the variable SMPS 111 to an AC voltage using a switching pulse signal having a frequency of a few kilohertz (kHz) to tens of megahertz (MHz). In other words, the power amplifier 112 converts a DC voltage supplied to a power amplifier to an AC voltage using a reference resonance frequency $F_{Ref}$, and generates a communication power to be used for communication, or a charging power to be used for charging that may be used in a plurality of target devices. The communication power may be, for example, a low power of 0.1 to 1 milliwatts (mW) that may be used by a target device to perform communication, and the charging power may be, for example, a high power of 1 mW to 200 Watts (W) that may be consumed by a device load of a target device. In this description, the term "charging" may refer to supplying power to an element or a unit that charges a battery or other rechargeable device with power. Also, the term "charging" may refer supplying power to an element or a unit that consumes power. For example, the term "charging power" may refer to power consumed by a target device while operating, or power used to charge a battery of the target device. The unit or the element may include, for example, a battery, a display device, a sound output circuit, a main processor, and various types of sensors.

In this description, the term "reference resonance frequency" refers to a resonance frequency that is nominally used by the source device 110, and the term "tracking frequency" refers to a resonance frequency used by the source device 110 that has been adjusted based on a predetermined scheme.

The TX controller 114 may detect a reflected wave of the communication power or a reflected wave of the charging power, and may detect mismatching between the target resonator 133 and the source resonator 131 based on the detected reflected wave. The TX controller 114 may detect the mismatching by detecting an envelope of the reflected wave, or by detecting an amount of a power of the reflected wave.

Under the control of the TX controller 114, the matching network 113 compensates for impedance mismatching between the source resonator 131 and the target resonator 133 so that the source resonator 131 and the target resonator 133 are optimally-matched. The matching network 113 includes combinations of a capacitor and an inductor that are connected to the TX controller 114 through a switch, which is under the control of the TX controller 114.

The TX controller 114 may calculate a voltage standing wave ratio (VSWR) based on a voltage level of the reflected wave and a level of an output voltage of the source resonator 131 or the power amplifier 112. When the VSWR is greater than a predetermined value, the TX controller 114 detects the mismatching. In this example, the TX controller 114 calculates a power transmission efficiency of each of N predetermined tracking frequencies, determines a tracking frequency $F_{Best}$ having the best power transmission efficiency among the N predetermined tracking frequencies, and changes the reference resonance frequency $F_{Ref}$ to the tracking frequency $F_{Best}$.

Also, the TX controller 114 may control a frequency of the switching pulse signal used by the power amplifier 112. By controlling the switching pulse signal used by the power amplifier 112, the TX controller 114 may generate a modulation signal to be transmitted to the target device 120. In other words, the communication unit 115 may transmit various messages to the target device 120 via in-band communication. Additionally, the TX controller 114 may detect a reflected wave, and may demodulate a signal received from the target device 120 through an envelope of the reflected wave.

The TX controller 114 may generate a modulation signal for in-band communication using various schemes. To generate a modulation signal, the TX controller 114 may turn on or off the switching pulse signal used by the power amplifier 112, or may perform delta-sigma modulation. Additionally, the TX controller 114 may generate a pulse-width modulation (PWM) signal having a predetermined envelope.

The communication unit 115 may perform out-of-band communication using a communication channel. The communication unit 115 may include a communication module, such as a ZigBee module, a Bluetooth module, or any other communication module, that the communication unit 115 may use to perform the out-of-band communication. The communication unit 115 may transmit or receive data 140 to or from the target device 120 via the out-of-band communication.

The source resonator 131 transfers electromagnetic energy 130, such as the communication power or the charging power, to the target resonator 133 via a magnetic coupling with the target resonator 133.

The target resonator 133 receives the electromagnetic energy 130, such as the communication power or the charging power, from the source resonator 131 via a magnetic coupling with the source resonator 131. Additionally, the target resonator 133 receives various messages from the source device 110 via the in-band communication.

The matching network 121 matches an input impedance viewed from the source device 110 to an output impedance viewed from a load. The matching network 121 may be configured with a combination of a capacitor and an inductor.

The rectifier 122 generates a DC voltage by rectifying an AC voltage received by the target resonator 133.

The DC/DC converter 123 adjusts a level of the DC voltage output from the rectifier 122 based on a voltage rating of the load. For example, the DC/DC converter 123 may adjust the level of the DC voltage output from the rectifier 122 to a level in a range from 3 volts (V) to 10 V.

The power detector 127 detects a voltage (e.g., $V_{dd}$) of an input terminal 126 of the DC/DC converter 123, and a current and a voltage of an output terminal of the DC/DC converter 123. The power detector 127 outputs the detected voltage of the input terminal 126, and the detected current and the detected voltage of the output terminal, to the RX controller 125. The RX controller 125 uses the detected voltage of the input terminal 126 to compute a transmission efficiency of power received from the source device 110. Additionally, the RX controller 125 uses the detected current and the detected voltage of the output terminal to compute an amount of power transferred to the load. The TX controller 114 of the source device 110 determines an amount of power that needs to be transmitted by the source device 110 based on an amount of power required by the load and the amount of power transferred to the load. When the communication unit 124 transfers an amount of power of the output terminal (e.g., the computed amount of power transferred to the load) to the source device 110, the TX controller 114 of the source device 110 may compute the amount of power that needs to be transmitted by the source device 110.

The communication unit 124 may perform in-band communication for transmitting or receiving data using a resonance frequency by demodulating a received signal obtained by detecting a signal between the target resonator 133 and the rectifier 122, or by detecting an output signal of the rectifier 122. In other words, the RX controller 125 may demodulate a message received via the in-band communication.

Additionally, the RX controller 125 may adjust an impedance of the target resonator 133 to modulate a signal to be transmitted to the source device 110. For example, the RX controller 125 may increase the impedance of the target resonator so that a reflected wave will be detected by the TX controller 114 of the source device 110. In this example, depending on whether the reflected wave is detected, the TX controller 114 of the source device 110 will detect a binary number "0" or "1".

The communication unit 124 may transmit, to the source device 110, any one or any combination of a response message including a product type of a corresponding target device, manufacturer information of the corresponding target device, a product model name of the corresponding target device, a battery type of the corresponding target device, a charging scheme of the corresponding target device, an impedance value of a load of the corresponding target device, information about a characteristic of a target resonator of the corresponding target device, information about a frequency band used the corresponding target device, an amount of power to be used by the corresponding target device, an intrinsic identifier of the corresponding target device, product version information of the corresponding target device, and standards information of the corresponding target device.

The communication unit 124 may also perform an out-of-band communication using a communication channel. The communication unit 124 may include a communication module, such as a ZigBee module, a Bluetooth module, or any other communication module known in the art, that the communication unit 124 may use to transmit or receive data 140 to or from the source device 110 via the out-of-band communication.

The communication unit 124 may receive a wake-up request message from the source device 110, detect an amount of a power received by the target resonator, and transmit, to the source device 110, information about the amount of the power received by the target resonator. In this example, the information about the amount of the power received by the target resonator may correspond to an input voltage value and an input current value of the rectifier 122, an output voltage value and an output current value of the rectifier 122, or an output voltage value and an output current value of the DC/DC converter 123.

The TX controller 114 sets a resonance bandwidth of the source resonator 131. Based on the resonance bandwidth of the source resonator 131, a Q-factor $Q_S$ of the source resonator 131 is set.

The RX controller 125 sets a resonance bandwidth of the target resonator 133. Based on the resonance bandwidth of the target resonator 133, a Q-factor $Q_D$ of the target resonator 133 is set. For example, the resonance bandwidth of the source resonator 131 may be set to be wider or narrower than the resonance bandwidth of the target resonator 133.

The source device 110 and the target device 120 communicate with each other to share information about the resonance bandwidth of the source resonator 131 and the resonance bandwidth of the target resonator 133. If power desired or needed by the target device 120 is greater than a reference value, the Q-factor $Q_S$ of the source resonator 131 may be set to be greater than 100. If the power desired or needed by the target device 120 is less than the reference value, the Q-factor $Q_S$ of the source resonator 131 may be set to less than 100.

In resonance-based wireless power transmission, a resonance bandwidth is a significant factor. If Qt indicates a Q-factor based on a change in a distance between the source resonator 131 and the target resonator 133, a change in a resonance impedance, impedance-mismatching, a reflected signal, or any other factor affecting a Q-factor, Qt is inversely proportional to a resonance bandwidth as expressed by the following Equation 1:

$$\frac{\Delta f}{f_0} = \frac{1}{Qt} = \Gamma_{S,D} + \frac{1}{BW_S} + \frac{1}{BW_D} \qquad (1)$$

In Equation 1, $f_0$ denotes a center frequency, $\Delta f$ denotes a bandwidth, $\Gamma_{S,D}$ denotes a reflection loss between resonators, $BW_S$ denotes a resonance bandwidth of the source resonator 131, and $BW_D$ denotes a resonance bandwidth of the target resonator 133.

An efficiency U of wireless power transmission may be expressed by the following Equation 2:

$$U = \frac{\kappa}{\sqrt{\Gamma_S \Gamma_D}} = \frac{\omega_0 M}{\sqrt{R_S R_D}} = \frac{\sqrt{Q_S Q_D}}{Q_\kappa} \qquad (2)$$

In Equation 2, $\kappa$ denotes a coupling coefficient of energy coupling between the source resonator 131 and the target resonator 133, $\Gamma_S$ denotes a reflection coefficient of the source resonator 131, $\Gamma_D$ denotes a reflection coefficient of the target resonator 133, $\omega_0$ denotes a resonance frequency, M denotes a mutual inductance between the source resonator 131 and the target resonator 133, $R_S$ denotes an impedance of the source resonator 131, $R_D$ denotes an impedance of the target resonator 133, $Q_S$ denotes a Q-factor of the source resonator 131, $Q_D$ denotes a Q-factor of the target resonator 133, and $Q_\kappa$ denotes a Q-factor of energy coupling between the source resonator 131 and the target resonator 133.

As can be seen from Equation 2, the Q-factor has a great effect on an efficiency of the wireless power transmission. Accordingly, the Q-factor may be set to a high value to increase the efficiency of the wireless power transmission. However, even when $Q_S$ and $Q_D$ are set to high values, the efficiency of the wireless power transmission may be reduced by a change in the coupling coefficient κ of the energy coupling, a change in a distance between the source resonator 131 and the target resonator 133, a change in a resonance impedance, impedance mismatching, and any other factor affecting the efficiency of the wireless power transmission.

If the resonance bandwidths $BW_S$ and $BW_D$ of the source resonator 131 and the target resonator 133 are set to be too narrow to increase the efficiency of the wireless power transmission, impedance mismatching and other undesirable conditions may easily occur due to insignificant external influences. In order to account for the effect of impedance mismatching, Equation 1 may be rewritten as the following Equation 3:

$$\frac{\Delta f}{f_0} = \frac{\sqrt{VSWR} - 1}{Qt\sqrt{VSWR}} \quad (3)$$

In an example in which an unbalanced relationship of a resonance bandwidth or a bandwidth of an impedance matching frequency between the source resonator 131 and the target resonator 133 is maintained, a reduction in efficiency of a wireless power transmission may be prevented due to a change in the coupling coefficient κ, a change in the distance between the source resonator 131 and the target resonator 133, and/or a change in a resonance impedance and/or impedance mismatching. In an example in which the unbalanced relationship of the resonance bandwidth or the bandwidth of the impedance matching frequency between the source resonator 131 and the target resonator 133 is maintained, based on Equations 1 and 3, an unbalanced relationship between the Q-factors $Q_S$ and $Q_D$ may also be maintained.

The source device 110 wirelessly transmits wake-up power used to wake up the target device 120, and broadcasts a configuration signal used to configure a wireless power transmission network. The source device 110 further receives, from the target device 120, a search frame including a receiving sensitivity of the configuration signal, and may further permit a join of the target device 120. The source device 110 may further transmit, to the target device 120, an ID used to identify the target device 120 in the wireless power transmission network. The source device 110 may further generate the charging power through a power control, and may further wirelessly transmit the charging power to the target device 120.

The target device 120 receives wake-up power from at least one of source devices, and activates a communication function, using the wake-up power. The target device 120 further receives, from at least one of the source devices, a configuration signal used to configure a wireless power transmission network, and may further select the source device 110 based on a receiving sensitivity of the configuration signal. The target device 120 may further wirelessly receive power from the selected source device 110.

In the following description, the term "resonator" used in the discussion of FIGS. 2A through 4B refers to both a source resonator and a target resonator.

Figure 2A:
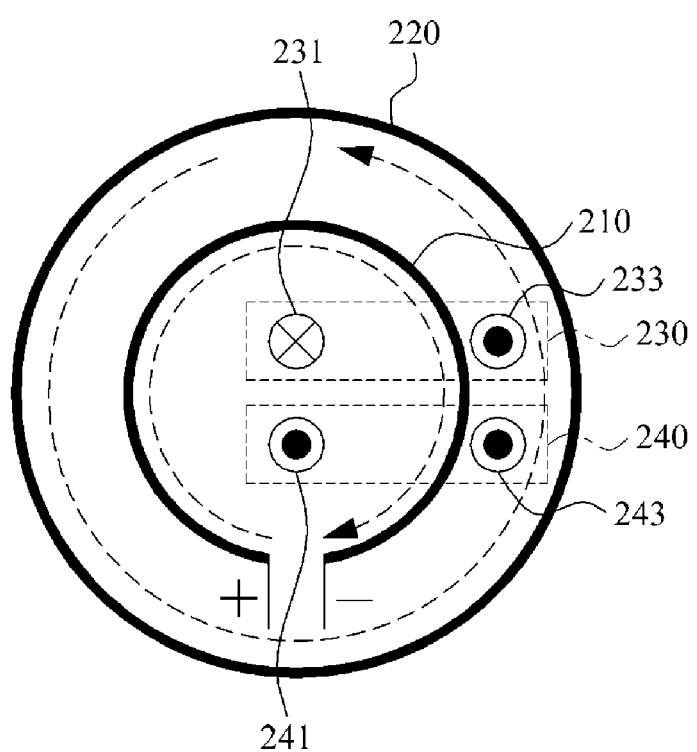
FIGS. 2A through 2B are diagrams illustrating examples of a distribution of a magnetic field in a feeder and a resonator of a wireless power resonator.
Figure 2B:
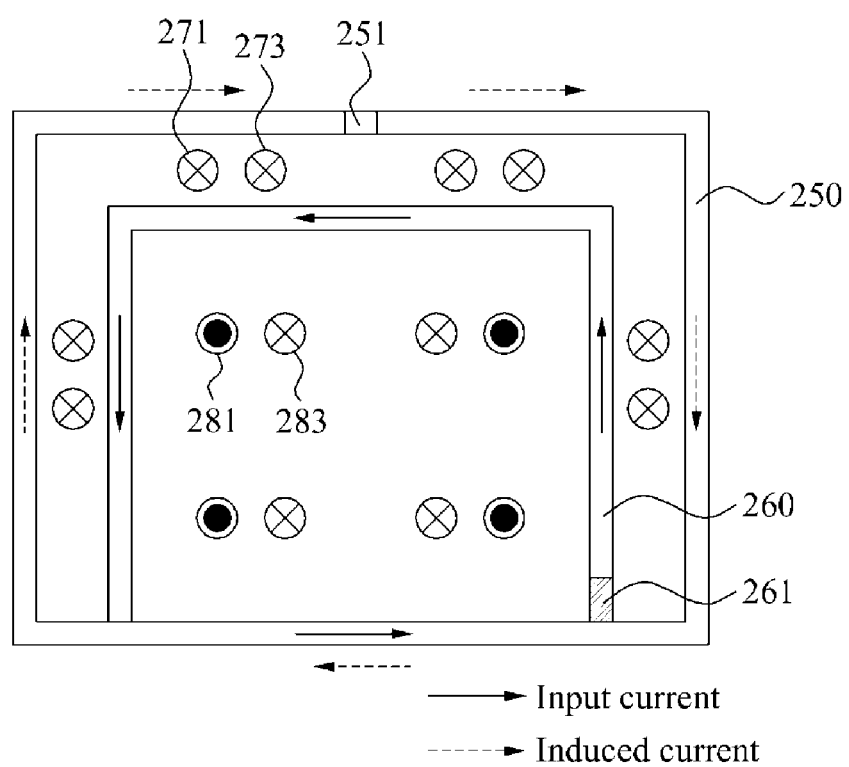

FIGS. 2A and 2B are diagrams illustrating examples of a distribution of a magnetic field in a feeder and a resonator of a wireless power transmitter. When a resonator receives power supplied through a separate feeder, magnetic fields are formed in both the feeder and the resonator.

FIG. 2A illustrates an example of a structure of a wireless power transmitter in which a feeder 210 and a resonator 220 do not have a common ground. Referring to FIG. 2A, as an input current flows into a feeder 210 through a terminal labeled "+" and out of the feeder 210 through a terminal labeled "−", a magnetic field 230 is formed by the input current. A direction 231 of the magnetic field 230 inside the feeder 210 is into the plane of FIG. 2A, and has a phase that is opposite to a phase of a direction 233 of the magnetic field 230 outside the feeder 210. The magnetic field 230 formed by the feeder 210 induces a current to flow in a resonator 220. The direction of the induced current in the resonator 220 is opposite to a direction of the input current in the feeder 210 as indicated by the dashed arrows in FIG. 2A.

The induced current in the resonator 220 forms a magnetic field 240. Directions of the magnetic field 240 are the same at all positions inside the resonator 220. Accordingly, a direction 241 of the magnetic field 240 formed by the resonator 220 inside the feeder 210 has the same phase as a direction 243 of the magnetic field 240 formed by the resonator 220 outside the feeder 210.

Consequently, when the magnetic field 230 formed by the feeder 210 and the magnetic field 240 formed by the resonator 220 are combined, a strength of the total magnetic field inside the resonator 220 decreases inside the feeder 210 and increases outside the feeder 210. In an example in which power is supplied to the resonator 220 through the feeder 210 configured as illustrated in FIG. 2A, the strength of the total magnetic field decreases in the center of the resonator 220, but increases outside the resonator 220. In another example in which a magnetic field is randomly distributed in the resonator 220, it is difficult to perform impedance matching since an input impedance will frequently vary. Additionally, when the strength of the total magnetic field increases, an efficiency of wireless power transmission increases. Conversely, when the strength of the total magnetic field is decreases, the efficiency of wireless power transmission decreases. Accordingly, the power transmission efficiency may be reduced on average.

FIG. 2B illustrates an example of a structure of a wireless power transmitter in which a resonator 250 and a feeder 260 have a common ground. The resonator 250 includes a capacitor 251. The feeder 260 receives a radio frequency (RF) signal via a port 261. When the RF signal is input to the feeder 260, an input current is generated in the feeder 260. The input current flowing in the feeder 260 forms a magnetic field, and a current is induced in the resonator 250 by the magnetic field. Additionally, another magnetic field is formed by the induced current flowing in the resonator 250. In this example, a direction of the input current flowing in the feeder 260 has a phase opposite to a phase of a direction of the induced current flowing in the resonator 250. Accordingly, in a region between the resonator 250 and the feeder 260, a direction 271 of the magnetic field formed by the input current has the same phase as a direction 273 of the magnetic field formed by the induced current, and thus the strength of the total magnetic field increases in the region between the resonator 250 and the feeder 260. Conversely, inside the feeder 260, a direction 281 of the magnetic field formed by the input current has a phase opposite to a phase of a direction 283 of the magnetic field formed by the induced current, and thus the strength of the total magnetic field decreases inside the feeder 260. Therefore, the strength of the total magnetic field decreases in the center of the resonator 250, but increases outside the resonator 250.

An input impedance may be adjusted by adjusting an internal area of the feeder 260. The input impedance refers to an impedance viewed in a direction from the feeder 260 to the resonator 250. When the internal area of the feeder 260 is increased, the input impedance is increased. Conversely, when the internal area of the feeder 260 is decreased, the input impedance is decreased. Because the magnetic field is randomly distributed in the resonator 250 despite a reduction in the input impedance, a value of the input impedance may vary based on a location of a target device. Accordingly, a separate matching network may be required to match the input impedance to an output impedance of a power amplifier. For example, when the input impedance is increased, a separate matching network may be used to match the increased input impedance to a relatively low output impedance of the power amplifier.

Figure 3A:
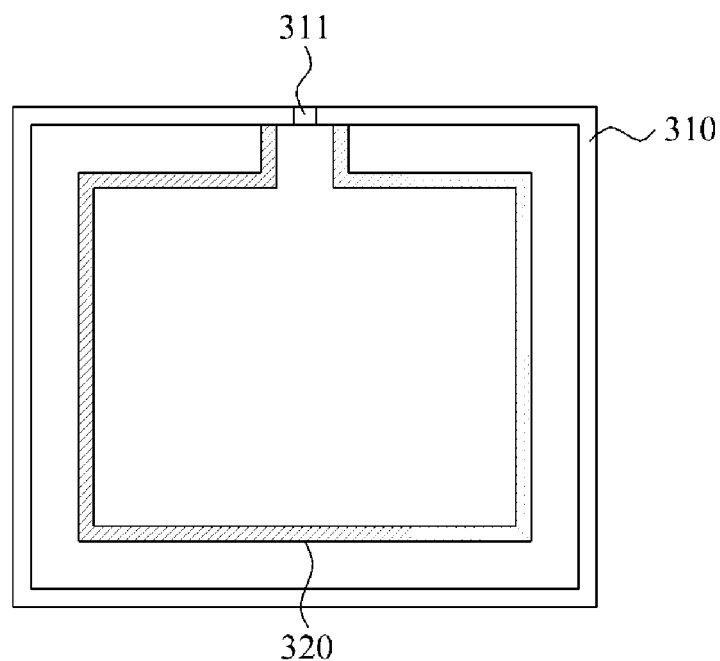
FIGS. 3A and 3B are diagrams illustrating an example of a feeding unit and a resonator of a wireless power transmitter.
Figure 3B:
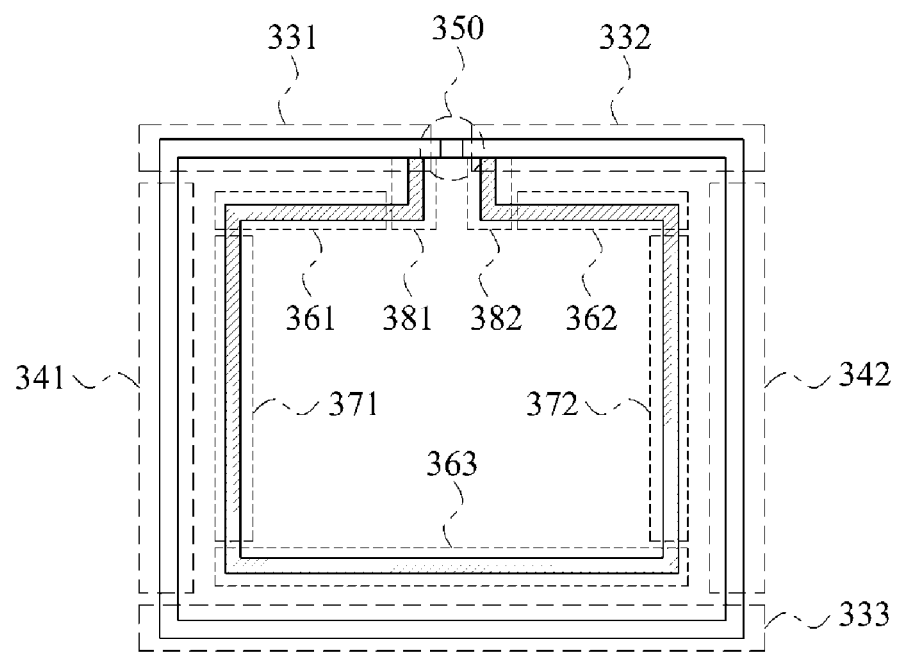

FIGS. 3A and 3B are diagrams illustrating an example of a feeding unit and a resonator of a wireless power transmitter. Referring to FIG. 3A, the wireless power transmitter includes a resonator 310 and a feeding unit 320. The resonator 310 further includes a capacitor 311. The feeding unit 320 is electrically connected to both ends of the capacitor 311.

FIG. 3B illustrates, in greater detail, a structure of the wireless power transmitter of FIG. 3A. The resonator 310 includes a first transmission line (not identified by a reference numeral in FIG. 3B, but formed by various elements in FIG. 3B as discussed below), a first conductor 341, a second conductor 342, and at least one capacitor 350.

The capacitor 350 is inserted in series between a first signal conducting portion 331 and a second signal conducting portion 332, causing an electric field to be confined within the capacitor 350. Generally, a transmission line includes at least one conductor in an upper portion of the transmission line, and at least one conductor in a lower portion of first transmission line. A current may flow through the at least one conductor disposed in the upper portion of the first transmission line, and the at least one conductor disposed in the lower portion of the first transmission line may be electrically grounded. In this example, a conductor disposed in an upper portion of the first transmission line in FIG. 3B is separated into two portions that will be referred to as the first signal conducting portion 331 and the second signal conducting portion 332. A conductor disposed in a lower portion of the first transmission line in FIG. 3B will be referred to as a first ground conducting portion 333.

As illustrated in FIG. 3B, the resonator 310 has a generally two-dimensional (2D) structure. The first transmission line includes the first signal conducting portion 331 and the second signal conducting portion 332 in the upper portion of the first transmission line, and includes the first ground conducting portion 333 in the lower portion of the first transmission line. The first signal conducting portion 331 and the second signal conducting portion 332 are disposed to face the first ground conducting portion 333. A current flows through the first signal conducting portion 331 and the second signal conducting portion 332.

One end of the first signal conducting portion 331 is connected to one end of the first conductor 341, the other end of the first signal conducting portion 331 is connected to the capacitor 350, and the other end of the first conductor 341 is connected to one end of the first ground conducting portion 333. One end of the second signal conducting portion 332 is connected to one end of the second conductor 342, the other end of the second signal conducting portion 332 is connected to the other end of the capacitor 350, and the other end of the second conductor 342 is connected to the other end of the ground conducting portion 333. Accordingly, the first signal conducting portion 331, the second signal conducting portion 332, the first ground conducting portion 333, the first conductor 341, and the second conductor 342 are connected to each other, causing the resonator 310 to have an electrically closed loop structure. The term "loop structure" includes a polygonal structure, a circular structure, a rectangular structure, and any other geometrical structure that is closed, i.e., that does not have any opening in its perimeter. The expression "having a loop structure" indicates a structure that is electrically closed.

The capacitor 350 is inserted into an intermediate portion of the first transmission line. In the example in FIG. 3B, the capacitor 350 is inserted into a space between the first signal conducting portion 331 and the second signal conducting portion 332. The capacitor 350 may be a lumped element capacitor, a distributed capacitor, or any other type of capacitor known to one of ordinary skill in the art. For example, a distributed element capacitor may include a zigzagged conductor line and a dielectric material having a relatively high permittivity disposed between parallel portions of the zigzagged conductor line.

The capacitor 350 inserted into the first transmission line may cause the resonator 310 to have a characteristic of a metamaterial. A metamaterial is a material having a predetermined electrical property that is not found in nature, and thus may have an artificially designed structure. All materials existing in nature have a magnetic permeability and permittivity. Most materials have a positive magnetic permeability and/or a positive permittivity.

For most materials, a right-hand rule may be applied to an electric field, a magnetic field, and a Poynting vector of the materials, so the materials may be referred to as right-handed materials (RHMs). However, a metamaterial that has a magnetic permeability and/or a permittivity that is not found in nature, and may be classified into an epsilon negative (ENG) material, a mu negative (MNG) material, a double negative (DNG) material, a negative refractive index (NRI) material, a left-handed (LH) material, and other metamaterial classifications known to one of ordinary skill in the art based on a sign of the magnetic permeability of the metamaterial and a sign of the permittivity of the metamaterial.

If the capacitor 350 is a lumped element capacitor and a capacitance of the capacitor 350 is appropriately determined, the resonator 310 may have a characteristic of a metamaterial. If the resonator 310 is caused to have a negative magnetic permeability by appropriately adjusting the capacitance of the capacitor 350, the resonator 310 may also be referred to as an MNG resonator. Various criteria may be applied to determine the capacitance of the capacitor 350. For example, the various criteria may include a criterion for enabling the resonator 310 to have the characteristic of the metamaterial, a criterion for enabling the resonator 310 to have a negative magnetic permeability at a target frequency, a criterion for enabling the resonator 310 to have a zeroth order resonance characteristic at the target frequency, and any other suitable criterion. Based on any one or any combination of the aforementioned criteria, the capacitance of the capacitor 350 may be appropriately determined.

The resonator 310, hereinafter referred to as the MNG resonator 310, may have a zeroth order resonance characteristic of having a resonance frequency when a propagation constant is "0". If the MNG resonator 310 has the zeroth order resonance characteristic, the resonance frequency is independent of a physical size of the MNG resonator 310. By changing the capacitance of the capacitor 350, the resonance frequency of the MNG resonator 310 may be changed without changing the physical size of the MNG resonator 310.

In a near field, the electric field is concentrated in the capacitor 350 inserted into the first transmission line, causing the magnetic field to become dominant in the near field. The MNG resonator 310 has a relatively high Q-factor when the capacitor 350 is a lumped element, thereby increasing a power transmission efficiency. The Q-factor indicates a level of an ohmic loss or a ratio of a reactance with respect to a resistance in the wireless power transmission. As will be understood by one of ordinary skill in the art, the efficiency of the wireless power transmission will increase as the Q-factor increases.

Although not illustrated in FIG. 3B, a magnetic core passing through the MNG resonator 310 may be provided to increase a power transmission distance.

Referring to FIG. 3B, the feeding unit 320 includes a second transmission line (not identified by a reference numeral in FIG. 3B, but formed by various elements in FIG. 3B as discussed below), a third conductor 371, a fourth conductor 372, a fifth conductor 381, and a sixth conductor 382.

The second transmission line includes a third signal conducting portion 361 and a fourth signal conducting portion 362 in an upper portion of the second transmission line, and includes a second ground conducting portion 363 in a lower portion of the second transmission line. The third signal conducting portion 361 and the fourth signal conducting portion 362 are disposed to face the second ground conducting portion 363. A current flows through the third signal conducting portion 361 and the fourth signal conducting portion 362.

One end of the third signal conducting portion 361 is connected to one end of the third conductor 371, the other end of the third signal conducting portion 361 is connected to one end of the fifth conductor 381, and the other end of the third conductor 371 is connected to one end of the second ground conducting portion 363. One end of the fourth signal conducting portion 362 is connected to one end of the fourth conductor 372, the other end of the fourth signal conducting portion 362 is connected to one end the sixth conductor 382, and the other end of the fourth conductor 372 is connected to the other end of the second ground conducting portion 363. The other end of the fifth conductor 381 is connected to the first signal conducting portion 331 at or near where the first signal conducting portion 331 is connected to one end of the capacitor 350, and the other end of the sixth conductor 382 is connected to the second signal conducting portion 332 at or near where the second signal conducting portion 332 is connected to the other end of the capacitor 350. Thus, the fifth conductor 381 and the sixth conductor 382 are connected in parallel to both ends of the capacitor 350. The fifth conductor 381 and the sixth conductor 382 are used as an input port to receive an RF signal as an input.

Accordingly, the third signal conducting portion 361, the fourth signal conducting portion 362, the second ground conducting portion 363, the third conductor 371, the fourth conductor 372, the fifth conductor 381, the sixth conductor 382, and the resonator 310 are connected to each other, causing the resonator 310 and the feeding unit 320 to have an electrically closed loop structure. The term "loop structure" includes a polygonal structure, a circular structure, a rectangular structure, and any other geometrical structure that is closed, i.e., that does not have any opening in its perimeter. The expression "having a loop structure" indicates a structure that is electrically closed.

If an RF signal is input to the fifth conductor 381 or the sixth conductor 382, input current flows through the feeding unit 320 and the resonator 310, generating a magnetic field that induces a current in the resonator 310. A direction of the input current flowing through the feeding unit 320 is identical to a direction of the induced current flowing through the resonator 310, thereby causing a strength of a total magnetic field to increase in the center of the resonator 310, and decrease near the outer periphery of the resonator 310.

An input impedance is determined by an area of a region between the resonator 310 and the feeding unit 320. Accordingly, a separate matching network used to match the input impedance to an output impedance of a power amplifier may not be necessary. However, if a matching network is used, the input impedance may be adjusted by adjusting a size of the feeding unit 320, and accordingly a structure of the matching network may be simplified. The simplified structure of the matching network may reduce a matching loss of the matching network.

The second transmission line, the third conductor 371, the fourth conductor 372, the fifth conductor 381, and the sixth conductor 382 of the feeding unit may have a structure identical to the structure of the resonator 310. For example, if the resonator 310 has a loop structure, the feeding unit 320 may also have a loop structure. As another example, if the resonator 310 has a circular structure, the feeding unit 320 may also have a circular structure.

FIG. 4A is a diagram illustrating an example of a distribution of a magnetic field in a resonator that is produced by feeding of a feeding unit, of a wireless power transmitter. FIG. 4A more simply illustrates the resonator 310 and the feeding unit 320 of FIGS. 3A and 3B, and the names of the various elements in FIG. 3B will be used in the following description of FIG. 4A without reference numerals.

A feeding operation may be an operation of supplying power to a source resonator in wireless power transmission, or an operation of supplying AC power to a rectifier in wireless power transmission. FIG. 4A illustrates a direction of input current flowing in the feeding unit, and a direction of induced current flowing in the source resonator. Additionally, FIG. 4A illustrates a direction of a magnetic field formed by the input current of the feeding unit, and a direction of a magnetic field formed by the induced current of the source resonator.

Referring to FIG. 4A, the fifth conductor or the sixth conductor of the feeding unit 320 may be used as an input port 410. In FIG. 4A, the sixth conductor of the feeding unit is being used as the input port 410. An RF signal is input to the input port 410. The RF signal may be output from a power amplifier. The power amplifier may increase and decrease an amplitude of the RF signal based on a power requirement of a target device. The RF signal input to the input port 410 is represented in FIG. 4A as an input current flowing in the feeding unit. The input current flows in a clockwise direction in the feeding unit along the second transmission line of the feeding unit. The fifth conductor and the sixth conductor of the feeding unit are electrically connected to the resonator. More specifically, the fifth conductor of the feeding unit is connected to the first signal conducting portion of the resonator, and the sixth conductor of the feeding unit is connected to the second signal conducting portion of the resonator. Accordingly, the input current flows in both the resonator and the feeding unit. The input current flows in a counterclockwise direction in the resonator along the first transmission line of the resonator.

The input current flowing in the resonator generates a magnetic field, and the magnetic field induces a current in the resonator due to the magnetic field. The induced current flows in a clockwise direction in the resonator along the first transmission line of the resonator. The induced current in the resonator transfers energy to the capacitor of the resonator, and also generates a magnetic field. In FIG. 4A, the input current flowing in the feeding unit and the resonator is indicated by solid lines with arrowheads, and the induced current flowing in the resonator is indicated by dashed lines with arrowheads.

A direction of a magnetic field generated by a current is determined based on the right-hand rule. As illustrated in FIG. 4A, within the feeding unit, a direction 421 of the magnetic field generated by the input current flowing in the feeding unit is identical to a direction 423 of the magnetic field generated by the induced current flowing in the resonator. Accordingly, a strength of the total magnetic field may increases inside the feeding unit.

In contrast, as illustrated in FIG. 4A, in a region between the feeding unit and the resonator, a direction 433 of the magnetic field generated by the input current flowing in the feeding unit is opposite to a direction 431 of the magnetic field generated by the induced current flowing in the resonator. Accordingly, the strength of the total magnetic field decreases in the region between the feeding unit and the resonator.

Typically, in a resonator having a loop structure, a strength of a magnetic field decreases in the center of the resonator, and increases near an outer periphery of the resonator. However, referring to FIG. 4A, since the feeding unit is electrically connected to both ends of the capacitor of the resonator, the direction of the induced current in the resonator is identical to the direction of the input current in the feeding unit. Since the direction of the induced current in the resonator is identical to the direction of the input current in the feeding unit, the strength of the total magnetic field increases inside the feeding unit, and decreases outside the feeding unit. As a result, due to the feeding unit, the strength of the total magnetic field increases in the center of the resonator having the loop structure, and decreases near an outer periphery of the resonator, thereby compensating for the normal characteristic of the resonator having the loop structure in which the strength of the magnetic field decreases in the center of the resonator, and increases near the outer periphery of the resonator. Thus, the strength of the total magnetic field may be constant inside the resonator.

A power transmission efficiency for transferring wireless power from a source resonator to a target resonator is proportional to the strength of the total magnetic field generated in the source resonator. Accordingly, when the strength of the total magnetic field increases inside the source resonator, the power transmission efficiency also increases.

Figure 4B:
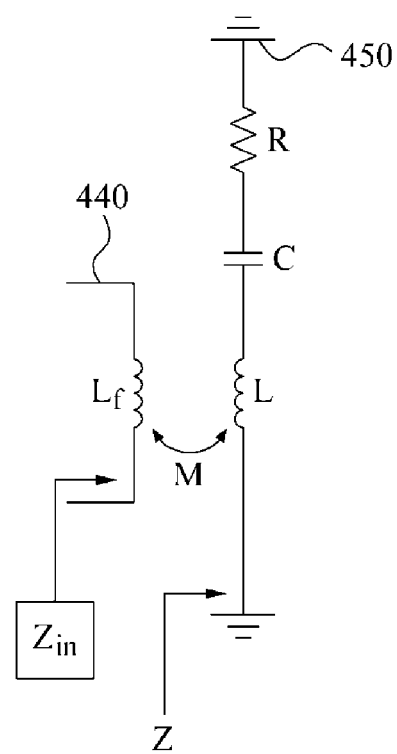
FIG. 4B is a diagram illustrating examples of equivalent circuits of a feeding unit and a resonator of a wireless power transmitter.

FIG. 4B is a diagram illustrating examples of equivalent circuits of a feeding unit and a resonator of a wireless power transmitter. Referring to FIG. 4B, a feeding unit 440 and a resonator 450 may be represented by the equivalent circuits in FIG. 4B. The feeding unit 440 is represented as an inductor having an inductance $L_f$, and the resonator 450 is represented as a series connection of an inductor having an inductance L coupled to the inductance $L_f$ of the feeding unit 440 by a mutual inductance M, a capacitor having a capacitance C, and a resistor having a resistance R. An example of an input impedance $Z_{in}$ viewed in a direction from the feeding unit 440 to the resonator 450 may be expressed by the following Equation 4:

$$Z_{in} = \frac{(\omega M)^2}{Z} \quad (4)$$

In Equation 4, M denotes a mutual inductance between the feeding unit 440 and the resonator 450, ω denotes a resonance frequency of the feeding unit 440 and the resonator 450, and Z denotes an impedance viewed in a direction from the resonator 450 to a target device. As can be seen from Equation 4, the input impedance $Z_{in}$ is proportional to the square of the mutual inductance M. Accordingly, the input impedance $Z_{in}$ may be adjusted by adjusting the mutual inductance M. The mutual inductance M depends on an area of a region between the feeding unit 440 and the resonator 450. The area of the region between the feeding unit 440 and the resonator 450 may be adjusted by adjusting a size of the feeding unit 440, thereby adjusting the mutual inductance M and the input impedance $Z_{in}$. Since the input impedance $Z_{in}$ may be adjusted by adjusting the size of the feeding unit 440, it may be unnecessary to use a separate matching network to perform impedance matching with an output impedance of a power amplifier.

In a target resonator and a feeding unit included in a wireless power receiver, a magnetic field may be distributed as illustrated in FIG. 4A. For example, the target resonator may receive wireless power from a source resonator via magnetic coupling. The received wireless power induces a current in the target resonator. The induced current in the target resonator generates a magnetic field, which induces a current in the feeding unit. If the target resonator is connected to the feeding unit as illustrated in FIG. 4A, a direction of the induced current flowing in the target resonator will be identical to a direction of the induced current flowing in the feeding unit. Accordingly, for the reasons discussed above in connection with FIG. 4A, a strength of the total magnetic field will increase inside the feeding unit, and will decrease in a region between the feeding unit and the target resonator.

Figure 5:
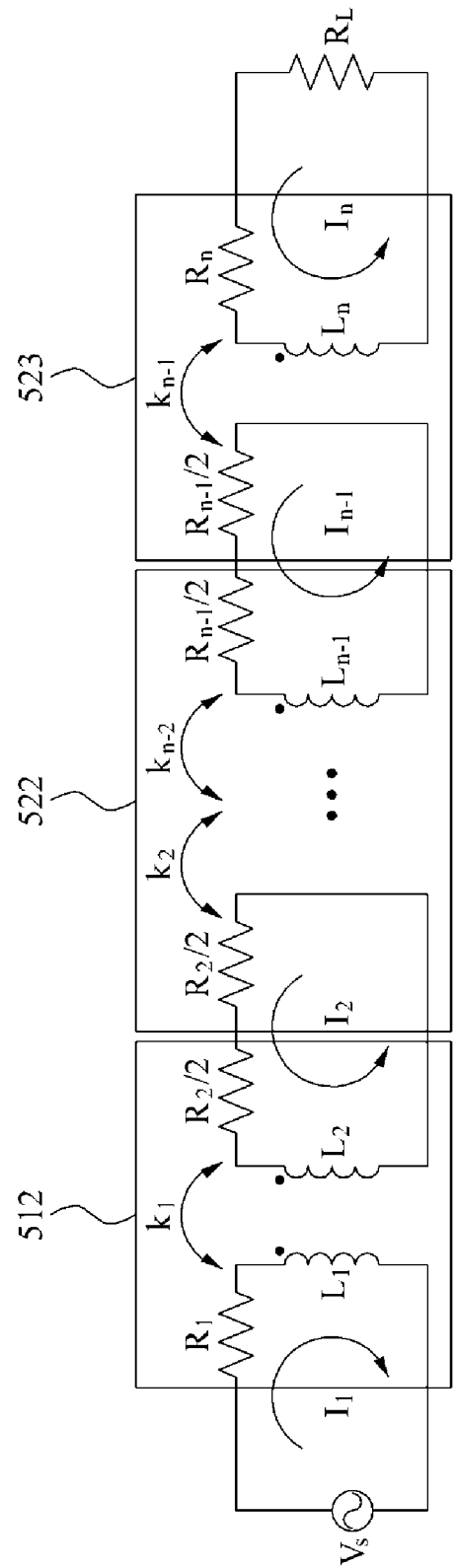
FIG. 5 is a diagram illustrating an example of a circuit of a wireless power transmission system including a plurality of relay resonators at a resonant frequency.

FIG. 5 is a diagram illustrating an example of a circuit of a wireless power transmission system including a plurality of relay resonators at a resonant frequency. The wireless power transmission system of FIG. 5 includes a wireless power transmitter configured to transfer power through a plurality of routes formed by a neighboring relay resonator, a relay resonator configured to relay power, and an RX resonator configured to receive power from the relay resonator. The RX resonator, the relay resonator, and an TX resonator that is included in the wireless power transmitter may be designed using Equations 5 through 11 below, and an ABCD matrix obtained by simplifying the plurality of routes to a two-port network, so that the wireless power transmission system may be operated in a predetermined maximum transmission efficiency.

Referring to FIG. 5, the wireless power transmission system includes three two-port networks corresponding to an TX-relay end 512, a relay-relay end 522, and a relay-RX end 523. ABCD matrices of the three two-port networks may be represented as respectively shown in Equations 5 through 7 below. In FIG. 5, n represents a total number of resonators including the TX resonator, the relay resonator, and the RX resonator.

$$\begin{pmatrix} \dfrac{R_1}{j\omega_0 \kappa_1 \sqrt{L_1 L_2}} & \dfrac{R_1 R_2 + 2\omega_0^2 \kappa_1^2 L_1 L_2}{j2\omega_0 \kappa_1 \sqrt{L_1 L_2}} \\ \dfrac{1}{j\omega_0 \kappa_1 \sqrt{L_1 L_2}} & \dfrac{R_2}{j\omega_0 \kappa_1 \sqrt{L_1 L_2}} \end{pmatrix} \quad (5)$$

-continued $$\begin{pmatrix} \frac{R_{i-1}}{j2\omega_0\kappa_{i-1}\sqrt{L_{i-1}L_i}} & \frac{R_{i-1}R_i + 4\omega_0^2\kappa_{i-1}^2 L_{i-1}L_i}{j4\omega_0\kappa_{i-1}\sqrt{L_{i-1}L_i}} \\ \frac{1}{j\omega_0\kappa_{i-1}\sqrt{L_{i-1}L_i}} & \frac{R_i}{j2\omega_0\kappa_{i-1}\sqrt{L_{i-1}L_i}} \end{pmatrix} \quad (6)$$

$$\begin{pmatrix} \frac{R_{n-1}}{j2\omega_0\kappa_{n-1}\sqrt{L_{n-1}L_n}} & \frac{R_{n-1}R_n + 2\omega_0^2\kappa_{n-1}^2 L_{n-1}L_n}{j2\omega_0\kappa_{n-1}\sqrt{L_{n-1}L_n}} \\ \frac{1}{j\omega_0\kappa_{n-1}\sqrt{L_{n-1}L_n}} & \frac{R_n}{j2\omega_0\kappa_{n-1}\sqrt{L_{n-1}L_n}} \end{pmatrix} \quad (7)$$

Figure 6:
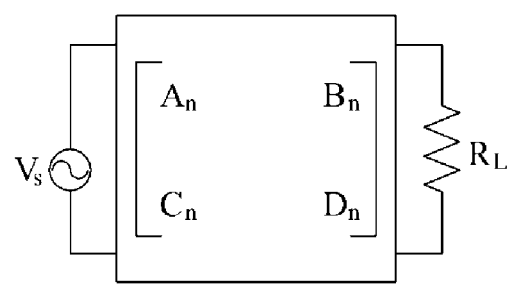
FIG. 6 is a diagram illustrating another example of a circuit of a wireless power transmission system including a plurality of relay resonators.

The wireless power transmission system of FIG. 5 divided into the ABCD matrices representing the TX-relay end 512, the relay-relay end 522, and the relay-RX end 523 may be expressed by a single ABCD matrix, as illustrated in FIG. 6. In FIG. 5, $V_S$ denotes voltage of a power supply of the TX resonator, measured in V, R denotes resistance of each resonator, measured in ohm, and L denotes inductance of each resonator, measured in henry (H). Additionally, κ or k denotes a coupling coefficient between resonators, $R_L$, denotes load resistance of a wireless power receiver including the RX resonator, and I denotes current flowing in each resonator, measured in ampere (A).

FIG. 6 is a diagram illustrating another example of a circuit of a wireless power transmission system including a plurality of relay resonators. The wireless power transmission system of FIG. 6 is represented by a single ABCD matrix. The ABCD matrix of FIG. 6 is obtained by simplifying the wireless power transmission system, and may be represented by multiplication of Equations 5 through 7.

A performance $\eta_{max}$ (i.e., a transmission efficiency) and a figure of merit $U^2(n)$ used to evaluate a maximum performance of the wireless power transmission system including the plurality of relay resonators may be represented as respectively shown in Equations 8 and 9 below. For example, the figure of merit $U^2(n)$ needed for an operation of Equation 8 may be represented by Equation 9 using an element of the ABCD matrix of FIG. 6.

$$\eta_{max}(U) = (-1)^n \left( \frac{U(n)}{1 + \sqrt{1 + U^2(n)}} \right) \quad (8)$$

$$U^2(n) = -\frac{1}{A_n D_n} \quad (9)$$

In Equations 8 and 9, a predetermined figure of merit of the wireless power transmission system may need to satisfy "$U^2(n) > 0.01$", or "$|A_n D_n| < 100$". Various combinations corresponding to Equations 5 through 7 may satisfy the predetermined figure of merit of the wireless power transmission system, and may include, for example, various wireless power transmission systems in which schemes of designing resonators, distances between resonators, arrangements between resonators, angles between resonators, and/or other elements of resonators, are different from each other.

Additionally, load resistance $R_L$ matched to the wireless power transmission system to obtain a maximum efficiency may be represented using an element of the single ABCD matrix, as shown in Equation 10 below.

$$R_L(n) = \sqrt{\frac{B_n D_n}{A_n C_n}} \quad (10)$$

In an example, an efficiency of the wireless power transmission system may be evaluated by measuring Equation 9. For example, when quality factors (Q-factors) $Q_t$ and $Q_r$ of the TX resonator and the RX resonator, respectively, are known, using Equation 9, a coupling coefficient Keff between the TX and RX resonators may be calculated using "$U^2 = -1/(A_n D_n) = \text{Keff}^2 Q_t Q_r$". Accordingly, the coupling coefficient Keff may be used as a numerical index indicating an increase in the performance of the wireless power transmission system, compared to a coupling coefficient K of a conventional system including two resonators.

In another example in which the coupling coefficient K between the RX resonator and the TX resonator is known, using Equation 9 in the wireless power transmission system including the plurality of relay resonators, Q-factors $Q_{teff}$ $Q_{reff}$ may be calculated using "$U^2 = -1/(AD) = K^2 Q_{teff} Q_{reff}$". Accordingly, the Q-factors $Q_{teff} Q_{reff}$ may be used as a numerical index indicating an increase in the performance of the wireless power transmission system, compared to Q-factors $Q_t Q_r$ of a conventional system including two resonators.

In still another example, in the wireless power transmission system including the plurality of relay resonators, the plurality of relay resonators may be arranged with a distance therebetween enabling a maximum efficiency to be obtained in the given wireless power transmission system by measuring Equation 9.

Figure 7:
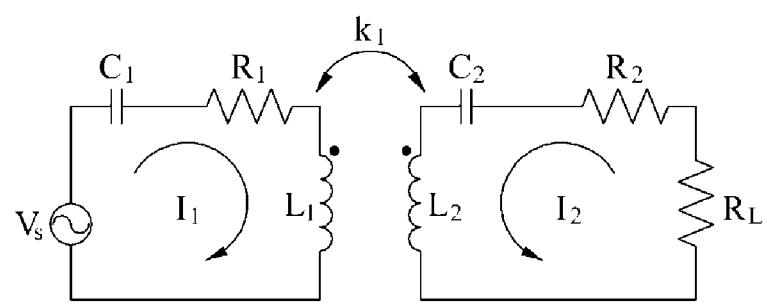
FIG. 7 is a diagram illustrating an example of a circuit of a wireless power transmission system including two resonators.

FIG. 7 is a diagram illustrating an example of a circuit of a wireless power transmission system including two resonators. The two resonators include an TX resonator and an RX resonator. Using an optimum design method for the wireless power transmission system of FIG. 7, a maximum power transmission efficiency $\eta_{max}$ may be derived based on the above-described Equations 8 through 10 induced using Equation 11 shown below. In FIG. 7, C denotes a capacitor of each resonator, measured in farad (F), L denotes inductance of each resonator, measured in H, R denotes resistance of each resonator, measured in ohm, $V_S$ denotes a power supply of the TX resonator, measured in V, I denotes current flowing in each resonator, measured in A, and $k_1$ denotes a coupling coefficient between the TX resonator and the RX resonator.

$$\eta_{max} = \left( \frac{U}{1 + \sqrt{1 + U^2}} \right)^2 \quad (11)$$

Figure 8:
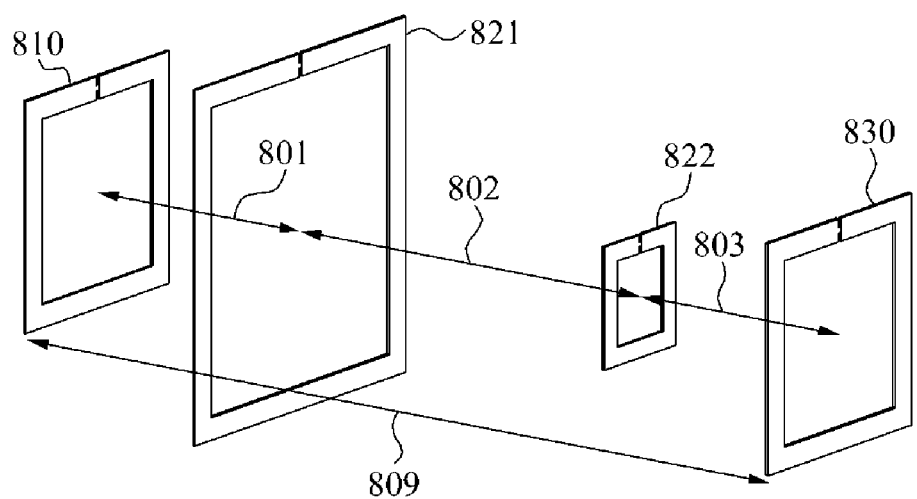
FIG. 8 is a diagram illustrating an example of a wireless power transmission system including relay resonators with different sizes.

FIG. 8 is a diagram illustrating an example of a wireless power transmission system including relay resonators with different sizes. In FIG. 8, the wireless power transmission system includes four resonators, for example, an TX resonator 810, an RX resonator 830, and two relay resonators, for example, a first relay resonator 821 and a second relay resonator 822. The relay resonators have different sizes.

A coupling coefficient between resonators may be determined based on a distance D 809 between the TX resonator 810 and the RX resonator 830, a distance d1 801 between the TX resonator 810 and the first relay resonator 821, a distance d2 803 between the RX resonator 830 and the second relay resonator 822, and/or a distance D-d1-d2 802 between the first relay resonator 821 and the second relay resonator 822. For example, when the relay resonators have different sizes, a distance between resonators may be represented by a coupling coefficient K. In this example, an arrangement for a maximum efficiency of the wireless power transmission system may be obtained from Equation 9. The resonators may be arranged with the distance therebetween corresponding to the coupling coefficient K, and accordingly, an optimum system may be designed. The distance corresponding to the coupling coefficient K is further described with reference to FIG. 9.

Figure 9:
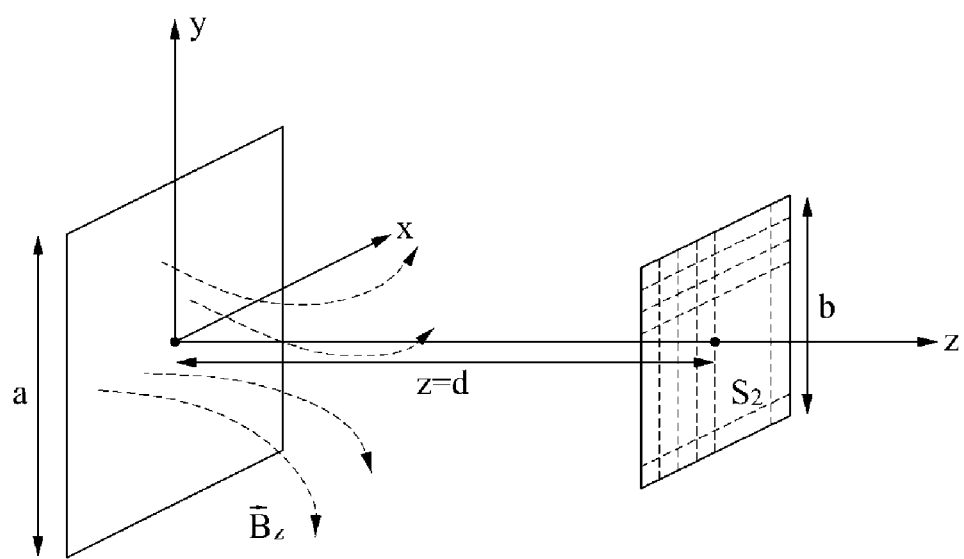
FIG. 9 is a diagram illustrating an example of a change in a coupling coefficient based on a distance, between resonators.

FIG. 9 is a diagram illustrating an example of a change in a coupling coefficient based on a distance, between resonators. Equation 12 below represents mutual inductance M between two resonators based on a distance between the two resonators, and Equation 13 below represents self inductance L of a resonator based on a size of the resonator. A coupling coefficient κ between resonators based on self inductances of the respective resonators and a mutual inductance between the resonators may be represented using Equations 12 and 13, as shown in Equation 14 below.

$$M_{12} = \frac{\Phi_{12}}{I_1} = \frac{\int_{S_2} \vec{B}_z \big|_{z=d} ds_2}{I_1} = \frac{1}{I_1} \sum_{x=-\frac{b}{2}}^{\frac{b}{2}} \sum_{y=-\frac{b}{2}}^{\frac{b}{2}} B_z \bigg|_{z=d} \Delta x \Delta y \quad (12)$$

$$L_1 = \frac{\Phi_{11}}{I_1} = \frac{\int_{S_1} \vec{B}_z \big|_{z=0} ds_1}{I_1} = \frac{1}{I_1} \sum_{x=-\frac{a}{2}}^{\frac{a}{2}} \sum_{y=-\frac{a}{2}}^{\frac{a}{2}} B_z \bigg|_{z=0} \Delta x \Delta y \quad (13)$$

$$\kappa_{12} = \frac{M_{12}}{\sqrt{L_1 L_2}} \quad (14)$$

In Equations 12 through 14, Φ denotes a magnetic flux of resonator(s), a denotes a size of a first resonator configured to transmit a magnetic field based on wireless power, and b denotes a size of a second resonator configured to receive a magnetic field based on wireless power. Additionally, $s_1$ denotes an area of the first resonator, $s_2$ denotes an area of the second resonator, $B_z$ denotes a strength of the magnetic field in the second resonator with respect to a z-axis direction, that is transmitted by the first resonator, and "z=d" denotes a distance between the first and second resonators in the z-axis direction.

Figure 10:
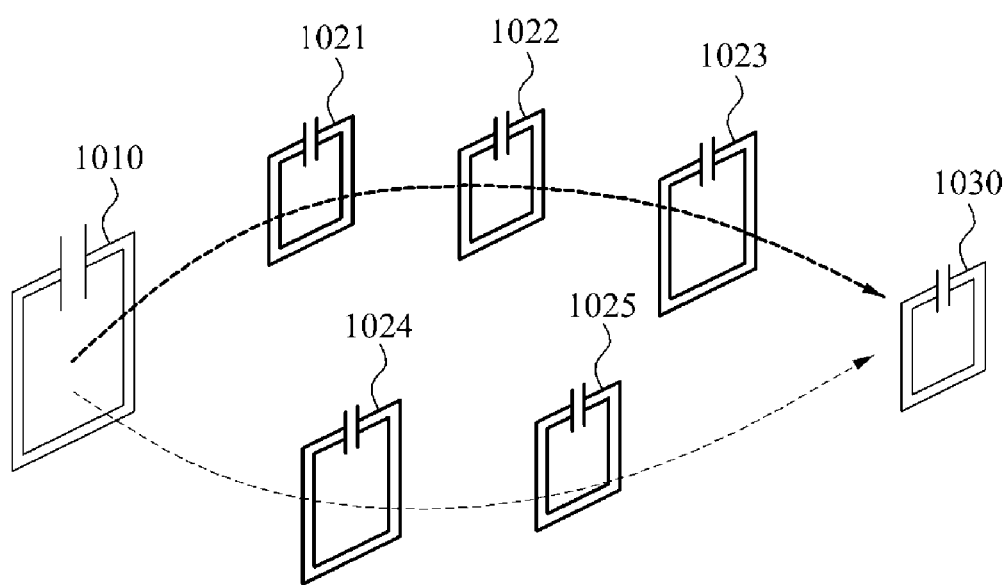
FIG. 10 is a diagram illustrating examples of power transfer routes in a wireless power transmission system including a transmission (TX) resonator, a reception (RX) resonator, and relay resonators.

FIG. 10 is a diagram illustrating examples of power transfer routes in a wireless power transmission system including an TX resonator, an RX resonator, and relay resonators. Referring to FIG. 10, power applied to an TX resonator 1010 is transferred to an RX resonator 1030 through relay resonators 1021, 1022, 1023, 1024 and 1025. For example, the TX resonator 1010 may be included in a wireless power transmitter.

For example, a first route may be used to transfer power through the relay resonators 1021, 1022 and 1023, and a second route may be used to transfer power through the relay resonators 1024 and 1025, as illustrated in FIG. 10. In addition to the first route and the second route, a large number of power transfer routes may exist.

For example, an efficiency of each of the power transfer routes may be determined using Equation 9, and a power transfer route with a maximum efficiency may be selected from the power transfer routes. In this example, a power transfer route may be selected and determined by activating or deactivating resonance of each relay resonator, for example, by controlling a capacitor of each relay resonator, using a switch, which will be further described with reference to FIG. 11.

Figure 11:
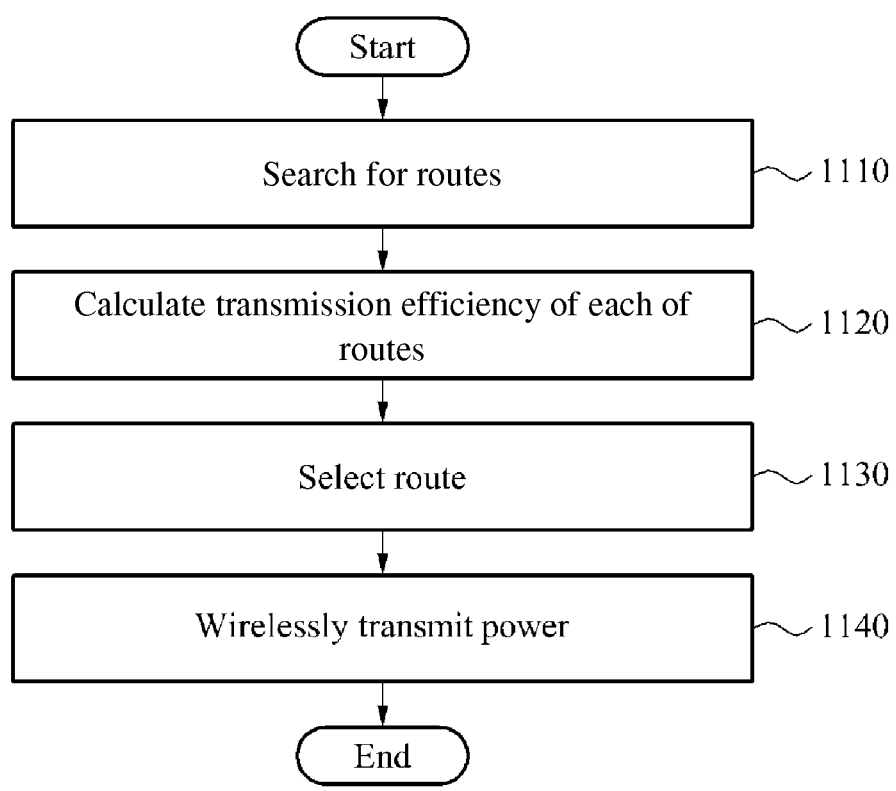
FIG. 11 is a flowchart illustrating an example of a wireless power transmission method.

FIG. 11 is a flowchart illustrating an example of a wireless power transmission method. In FIG. 11, a wireless power transmitter including an TX resonator may perform the wireless power transmission method; however, there is no limitation thereto. Accordingly, based on a wireless power transmission system, a wireless power receiver including an RX resonator and a plurality of relay resonators may receive power through the wireless power transmission method.

In operation 1110, the wireless power transmitter searches for a plurality of routes that may be used to transfer power. Each of the routes may be used to transfer power based on a combination of the relay resonators. In detail, the wireless power transmitter searches for the relay resonators neighboring the wireless power transmitter. The wireless power transmitter receives information of power transfer from the relay resonators and the RX resonator. The information of the power transfer may include, for example, a distance between each of the relay resonators and the RX resonator, a distance between each of the relay resonators and the TX resonator, a distance between the relay resonators, a size of each of the relay resonators, one or more power transfer routes based on a combination of the relay resonators, current and voltage applied to the RX resonator, and/or information used to extract an element of an ABCD matrix obtained by simplifying the entire wireless power transmission system or each of the routes. The wireless power transmitter searches for the routes based on the received information of the power transfer.

In operation 1120, the wireless power transmitter converts the routes to respective two-port networks, and calculates a transmission efficiency of each of the routes based on the two-port networks, using a processor of the wireless power transmitter. For example, the wireless power transmitter may simplify each of the routes to a predetermined ABCD matrix, and may calculate the transmission efficiency of each of the routes based on the respective ABCD matrix. That is, a transmission efficiency of a route to be matched to a load resistance of the wireless power transmission system may be calculated. For example, a route with a transmission efficiency that is calculated based on an ABCD matrix and the load resistance, and that is greater than a predetermined efficiency, may be matched to the load resistance.

In an example, a transmission efficiency of a route may be calculated based on a predetermined figure of merit of the route and the load resistance. The figure of merit may be acquired from the above-described Equation 9, using an element of an ABCD matrix obtained by simplifying the wireless power transmission system including the relay resonators, namely, the route, to a two-port network. Additionally, the load resistance may be extracted from the above-described Equation 10, using an element of the ABCD matrix obtained by simplifying the wireless power transmission system including the relay resonators, namely, the route, to the two-port network.

For example, an TX-relay end, a relay-relay end, and a relay-RX end in the wireless power transmission system including the relay resonators may be converted to respective ABCD matrices as two-port networks, using Equations 5 through 7. Additionally, the wireless power transmission system may be expressed by a single two-port network, using the ABCD matrices. That is, a single ABCD matrix representing the wireless power transmission system may be extracted by multiplying the ABCD matrices representing the TX-relay end, the relay-relay end, and the relay-RX end, respectively. In this example, values, for example a figure of merit and the load resistance, may be calculated using an element of the single ABCD matrix, and these values may be used to determine a maximum efficiency of the wireless power transmission system.

In another example, a transmission efficiency of a route may be calculated based on a coupling coefficient between arranged resonators of the route that is determined based on a distance between the arranged resonators.

In operation 1130, the wireless power transmitter selects a route with a highest transmission efficiency from the routes based on respective combinations of the relay resonators. In an example, the wireless power transmitter may select, using the processor, a route with a maximum transmission efficiency from the routes with calculated transmission efficiencies. In this example, the wireless power transmitter may deactivate resonance of each relay resonator to which power is not transferred, and may activate resonance of each relay resonator to which power is transferred, based on the selected route. For example, the wireless power transmitter may transfer, using a communication unit, a command to activate or deactivate resonance of each relay resonator.

In operation 1140, the wireless power transmitter wirelessly transmits power to the RX resonator, through the selected route. In the example of the wireless power transmission system including the relay resonators, the maximum efficiency may be interpreted from the two-port network simplified by multiplying the ABCD matrices corresponding to the TX-relay end, the relay-relay end, and the relay-RX end, despite a large number of resonators. In this example, even when a number of resonators increases in the wireless power transmission system, the maximum efficiency may be easily calculated using the simplified ABCD matrix.

Figure 12:
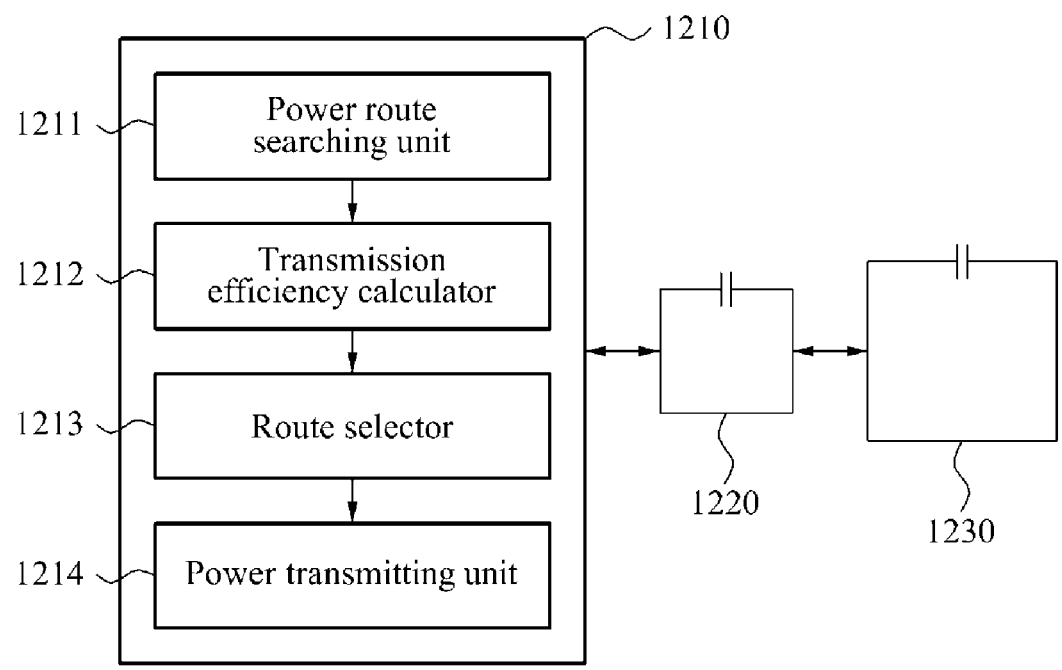
FIG. 12 is a diagram illustrating another example of a wireless power transmission system.

FIG. 12 is a diagram illustrating another example of a wireless power transmission system. Referring to FIG. 12, the wireless power transmission system includes a wireless power transmitter 1210, a plurality of relay resonators 1220, and an RX resonator 1230. The wireless power transmitter 1210 includes a power route searching unit 1211, a transmission efficiency calculator 1212, a route selector 1213, and a power transmitting unit 1214.

The wireless power transmitter 1210 selects a route corresponding to a two-port network with a maximum transmission efficiency from two-port networks obtained by simplifying a plurality of routes formed by the relay resonators 1220, and transfers power through the selected route. The power route searching unit 1211, the transmission efficiency calculator 1212, the route selector 1213, and the power transmitting unit 1214 included in the wireless power transmitter 1210 will be further described below.

The power route searching unit 1211 searches for the neighboring relay resonators 1220. The power route searching unit 1211 receives information of power transfer from a wireless power relay unit including the relay resonators 1220 and a wireless power receiver including the RX resonator 1230. The information of the power transfer may be similar to the information of the power transfer that is described above in FIG. 11.

The power route searching unit 1211 may receive the information of the power transfer, through a communication unit. The communication unit may include, for example, a communication module that may communicate with one or more protocols, such as Wi-Fi, ZigBee, Bluetooth, and/or other protocols known to one of ordinary skill in the art. The power route searching unit 1211 searches for the routes that may be used to transfer power, based on the received information, and may store the found routes. Each of the routes may be used to transfer power based on a combination of the relay resonators 1220.

The transmission efficiency calculator 1212 converts the routes to respective two-port networks, and calculates a transmission efficiency of each of the routes based on the two-port networks. For example, by sequentially activating or deactivating each of the relay resonators 1220, a transmission efficiency for each combination of the relay resonators 1220 may be calculated based on the information of the power transfer. In an example, a transmission efficiency may be calculated using the above-described Equations 8 through 10, based on a predetermined figure of merit and load resistance, which may be determined based an ABCD matrix representing a two-port network. In another example, a transmission efficiency may be calculated based on a coupling coefficient between arranged resonators that is determined based on a distance between the arranged resonators.

The transmission efficiency calculator 1212 may include a figure-of-merit acquirer and a single matrix extractor, although not illustrated in FIG. 12. The figure-of-merit acquirer may acquire a figure of merit based on an element of an ABCD matrix obtained by simplifying the wireless power transmission system including the relay resonators 1220. The single matrix extractor may extract an ABCD matrix obtained by simplifying each of the routes, to determine the load resistance matched to the transmission efficiency of each of the routes.

The route selector 1213 selects a route with a highest transmission efficiency from the routes. As described above in FIG. 11, the route selector 1213 may select the route by activating or deactivating resonance of each of the relay resonators 1220 based on the routes. For example, the resonance of each of the relay resonators 1220 may be activated and deactivated by powering on and off a switch connected to a capacitor of each of the relay resonators 1220.

The power transmitting unit 1214 wirelessly transmits power to the RX resonator 1230 through the selected route.

The relay resonators 1220 relays power received from the wireless power transmitter 1210. The RX resonator 1230 receives power from the relay resonator 1220.

The examples of the wireless power transmission system and method described may form a large number of power transfer routes when a large number of relay resonators are included in the wireless power transmission system. It is possible to search for an optimum power transfer route with a maximum transmission efficiency, using Equation 9. Additionally, a matching impedance value used to obtain a maximum efficiency in each route may be calculated as an element of an ABCD matrix of each route. By adjusting load resistance based on the matching impedance value, power may be wirelessly transmitted at a maximum transmission efficiency. A matching scheme to obtain a maximum performance of the wireless power transmission system may be performed using Equation 10.

The various units, modules, elements, and methods described above may be implemented using one or more hardware components, one or more software components, or a combination of one or more hardware components and one or more software components.

A hardware component may be, for example, a physical device that physically performs one or more operations, but is not limited thereto. Examples of hardware components include microphones, amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

As a non-exhaustive illustration only, a device described herein may refer to mobile devices such as, for example, a cellular phone, a smart phone, a wearable smart device (such as, for example, a ring, a watch, a pair of glasses, a bracelet, an ankle bracket, a belt, a necklace, an earring, a headband, a helmet, a device embedded in the cloths or the like), a personal computer (PC), a tablet personal computer (tablet), a phablet, a personal digital assistant (PDA), a digital camera, a portable game console, an MP3 player, a portable/personal multimedia player (PMP), a handheld e-book, an ultra mobile personal computer (UMPC), a portable lab-top PC, a global positioning system (GPS) navigation, and devices such as a high definition television (HDTV), an optical disc player, a DVD player, a Blue-ray player, a setup box, or any other device capable of wireless communication or network communication consistent with that disclosed herein. In a non-exhaustive example, the wearable device may be self-mountable on the body of the user, such as, for example, the glasses or the bracelet. In another non-exhaustive example, the wearable device may be mounted on the body of the user through an attaching device, such as, for example, attaching a smart phone or a tablet to the arm of a user using an armband, or hanging the wearable device around the neck of a user using a lanyard.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A wireless power transmission method comprising:
searching for one or more routes to be used to transmit power to a reception resonator through one or more relay resonators;
converting the routes to respective one or more two-port networks;
calculating a transmission efficiency of each of the routes based on the two-port networks;
selecting a route with a highest transmission efficiency from the routes; and
wirelessly transmitting power to the reception resonator through the selected route,
wherein:
the converting comprises converting the routes to respective ABCD matrices, and
the calculating comprises calculating the transmission efficiency of at least one of the routes based on a multiplication of the ABCD matrices corresponding to the at least one of the routes.

2. The wireless power transmission method of claim 1, wherein the calculating comprises:
calculating a transmission efficiency of a route matched to a load resistance of a wireless power receiver among the routes.

3. The wireless power transmission method of claim 1, wherein the calculating comprises:
calculating a transmission efficiency of a route among the routes based on a predetermined figure of merit of the route and a load resistance of a wireless power receiver.

4. The wireless power transmission method of claim 3, wherein:
the converting comprises converting the route to an ABCD matrix; and
the calculating comprises acquiring the predetermined figure of merit based on an element of the ABCD matrix.

5. The wireless power transmission method of claim 3, wherein:
the converting comprises converting the route to an ABCD matrix; and
the calculating comprises extracting the load resistance based on an element of the ABCD matrix.

6. The wireless power transmission method of claim 1, wherein the selecting comprises:
deactivating resonance of a relay resonator, among the relay resonators, to which power is not transferred, based on the selected route; and
activating resonance of a relay resonator, among the relay resonators, to which power is transferred, based on the selected route.

7. The wireless power transmission method of claim 1, wherein the searching comprises:
receiving information of power transfer from one or more wireless power relays comprising the relay resonators, and a wireless power receiver comprising the reception resonator; and
searching for the routes based on the information.

8. The wireless power transmission method of claim 1, wherein the calculating comprises:

calculating a transmission efficiency of a route based on a coupling coefficient determined based on a distance between resonators among a transmission resonator, the relay resonators, and the reception resonator.

9. A wireless power transmitter comprising:
a power route searching unit configured to search for one or more routes to be used to transmit power to a reception resonator through one or more relay resonators;
a transmission efficiency calculator configured to convert the routes to respective one or more two-port networks, and calculate a transmission efficiency of each of the routes based on the two-port networks;
a route selector configured to select a route with a highest transmission efficiency from the routes; and
a power transmitting unit configured to wirelessly transmit power to the reception resonator through the selected route,
wherein the transmission efficiency calculator is configured to:
convert the routes to respective ABCD matrices, and
calculate the transmission efficiency of at least one of the routes based on a multiplication of the ABCD matrices corresponding to the at least one of the routes.

10. The wireless power transmitter of claim 9, wherein the transmission efficiency calculator is configured to:
calculate a transmission efficiency of a route matched to a load resistance of a wireless power receiver among the routes.

11. The wireless power transmitter of claim 9, wherein the transmission efficiency calculator is configured to:
calculate a transmission efficiency of a route among the routes based on a predetermined figure of merit of the route and a load resistance of a wireless power receiver.

12. The wireless power transmitter of claim 11, wherein the transmission efficiency calculator is configured to:
convert the route to an ABCD matrix; and
acquire the predetermined figure of merit based on an element of the ABCD matrix.

13. The wireless power transmitter of claim 11, wherein the transmission efficiency calculator is configured to:
convert the route to an ABCD matrix; and
extract the load resistance based on an element of the ABCD matrix.

14. The wireless power transmitter of claim 9, wherein the route selector is configured to:
deactivate resonance of a relay resonator, among relay resonators, to which power is not transferred, based on the selected route; and
activate resonance of a relay resonator, among relay resonators, to which power is transferred, based on the selected route.

15. The wireless power transmitter of claim 9, wherein the power route searching unit is configured to:
receive information of power transfer from one or more wireless power relays comprising the relay resonators, and a wireless power receiver comprising the reception resonator; and
search for the routes based on the information.

16. The wireless power transmitter of claim 9, wherein the transmission efficiency calculator is configured to:
calculate a transmission efficiency of a route based on a coupling coefficient determined based on a distance between resonators among a transmission resonator, the relay resonators, and the reception resonator.

17. An apparatus comprising:
a transmission efficiency calculator configured to
  convert one or more routes to respective one or more matrices, each of the routes comprising a transmission resonator, one or more relay resonators, and a reception resonator, and
  calculate a transmission efficiency of each of the routes based on the matrices; and
a route selector configured to select a route with a highest transmission efficiency from the routes, to be used to wirelessly transmit power,
the transmission efficiency calculator is configured to
  convert the transmission resonator, the one or more relay resonators, and the reception resonator to respective ABCD matrices, and
  calculate a transmission efficiency of the route based on a multiplication of the ABCD matrices.

18. The apparatus of claim 17, wherein:
a route, among the routes, comprises a transmission-relay end comprising the transmission resonator and a first one of the relay resonators, a relay end comprising the relay resonators, and a relay-reception end comprising a last one of the relay resonators and the reception resonator.

* * * * *